(12) United States Patent
Severac et al.

(10) Patent No.: US 6,248,179 B1
(45) Date of Patent: Jun. 19, 2001

(54) METHOD OF REMOVING POLYMERIC MATERIAL ON A SILICON WATER

(75) Inventors: Didier Severac, Rousset; Michel Derie, Aix En Provence, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/209,166

(22) Filed: Dec. 10, 1998

(30) Foreign Application Priority Data

Dec. 12, 1997 (FR) .................................................. 97 16039

(51) Int. Cl.⁷ ...................................................... C23G 1/02
(52) U.S. Cl. .................................. 134/3; 134/1.1; 134/1.2; 134/1.3; 134/2; 134/25.4; 134/26; 134/27; 134/28; 134/30; 134/31; 134/32; 134/33; 134/34; 134/36; 134/37; 134/41; 134/902; 436/704; 436/719; 436/963
(58) Field of Search ................................ 134/1.1, 1.2, 2, 134/3, 25.4, 26, 27, 28, 30, 31, 32, 33, 34, 36, 37, 41, 902; 438/719, 704, 963

(56) References Cited

U.S. PATENT DOCUMENTS

| | | | |
|---|---|---|---|
| 4,235,011 | * 11/1980 | Butler et al. | 29/571 |
| 4,749,490 | * 6/1988 | Blackwood et al. | 156/646 |
| 5,158,100 | * 10/1992 | Tanaka et al. | 134/105 |
| 5,181,985 | * 1/1993 | Lampert et al. | 156/635 |
| 5,248,380 | * 9/1993 | Tanaka | 156/626 |
| 5,303,671 | 4/1994 | Kondo et al. | 118/719 |
| 5,487,398 | 1/1996 | Ohmi et al. | 134/95.1 |
| 5,571,367 | 11/1996 | Nakajima et al. | 156/345 |
| 5,678,116 | 10/1997 | Sugimoto et al. | 396/611 |
| 5,746,884 | * 5/1998 | Gupta et al. | 156/643.1 |
| 5,817,579 | * 10/1998 | Ko et al. | 438/740 |
| 5,872,061 | * 2/1999 | Lee et al. | 438/705 |
| 5,904,154 | * 5/1999 | Chien et al. | 134/1.2 |
| 5,925,577 | * 7/1999 | Solis | 438/725 |
| 5,956,585 | * 9/1999 | Wen | 438/238 |

FOREIGN PATENT DOCUMENTS

0 753 884    1/1997   (EP) .............................. H01L/21/00

OTHER PUBLICATIONS

French Search Report from French Patent Application 97 16039, filed Dec. 12, 1997.

* cited by examiner

Primary Examiner—Sharidan Carrillo
(74) Attorney, Agent, or Firm—Wolf, Greenfield & Sacks, P.C.; James H. Morris; Theodore E. Galanthay

(57) ABSTRACT

A method of removal of polymers of the type including bromine, chlorine, silicon, and carbon, present on a semiconductor wafer partly covered with resist, including of rotating the wafer in its plane around its axis, in an enclosure under a controlled atmosphere, at ambient temperature, including the steps of rotating the wafer at a speed included between 500 and 2000 CPM in an enclosure filled with nitrogen; sprinkling the wafer with water, substantially at the center of the wafer; introducing hydrofluoric acid during a determined cleaning time, while maintaining the sprinkling; and rinsing the wafer by continuing the sprinkling to remove any trace of hydrofluoric acid from the wafer, at the end of the cleaning time.

9 Claims, 1 Drawing Sheet

METHOD OF REMOVING POLYMERIC MATERIAL ON A SILICON WATER

BACKGROUND OF THE INVENTION

1. Field of the Invention

Figure 1:
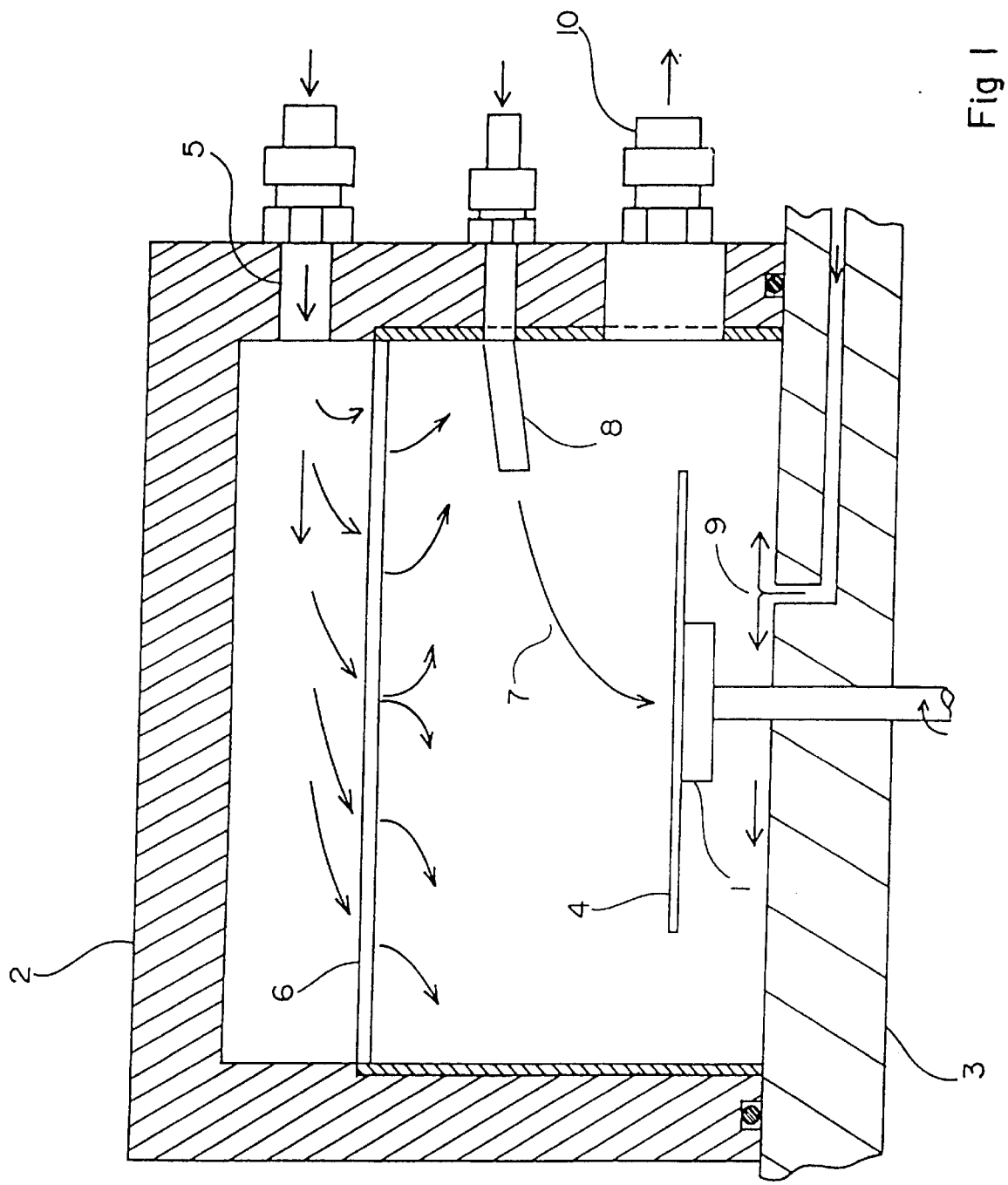

The present invention relates to the cleaning of a semiconductor wafer and more specifically the cleaning of a semiconductor wafer exhibiting, after plasma etching, traces of a brominated residual polymer.

2. Discussion of the Related Art

The manufacturing of integrated circuits from silicon wafers requires many steps of etching and implantation of various materials according to some predetermined patterns. A specific step consists of creating, on a thin silicon oxide layer, patterns formed of polysilicon. For this purpose, a uniform polysilicon wafer is deposited over the entire surface of the silicon oxide. This polysilicon layer is covered with a uniform resist layer, in which are formed the patterns which are desired to be reproduced on the polysilicon, by a conventional photolithographic etching method.

The wafer is then submitted to a plasma etching which will etch the polysilicon anisotropically in a direction substantially perpendicular to the wafer surface and form the desired patterns in the polysilicon. This plasma etching operation consists of digging vertical holes of various cross-sections in the polysilicon. At the end of the etching, it can be seen that a thin film especially formed of a polymer including bromine, chlorine, silicon, and carbon, has been deposited on the substantially vertical walls of the hole.

The following step of the manufacturing process consists of an ion implantation during which the existence of a resin layer above the polysilicon patterns is required. The presence of the substantially conductive brominated film on the hole walls as well as on the oxide surface is then undesirable and substantially decreases the manufacturing output, that is, the number of good circuits obtained with one wafer.

A conventional method to remove the polymer film consists of completely cleaning the surface of the silicon wafer, that is, completely removing the resist, then performing a hydrofluoric acid etch to remove the polymer traces, then reinstalling a resin layer at the desired locations. This solution requires a great number of steps and one of them, that is, the reinstallation of the resin at the desired locations after cleaning, is particularly difficult for reasons of at least mask repositioning.

Another conventional method consists of rotating the wafer in its plane around its axis, at a rotation speed of approximately 100 CPM; submitting it for a predetermined duration to an atmosphere composed of hydrofluoric acid, water vapor, and nitrogen; then rinsing by means of a water squirt. A major disadvantage of this method is that the proportions between hydrofluoric acid in gas form and water vapor, as well as the time of exposure of the silicon wafer to this atmosphere are parameters which are difficult to adequately adjust for each processed batch of wafers. This method often results either in an incomplete removal of the polymer film, or in an at least partial delamination of the resin layer. There exists between the resin and the polysilicon a thin layer of a adherence-enhancing material which seems to be rapidly deteriorated by a cleaning according to this method. Further, this method results in an erosion of the silicon oxide layer coming close to 30 nanometers. In the context of technologies using a relatively thin oxide, such an oxide erosion can be excessive and result in undesirable modifications of the electric behavior of the elements of the circuit using the silicon oxide layer. Further, when the silicon oxide layer is very thin, there is a high risk of piercing thereof.

SUMMARY OF THE INVENTION

An object of the present invention is to provide a method enabling, in an economic and reliable manner, to reduce or eliminate the output defects due to the residual polymer film while maintaining the upper resin layer intact.

To achieve this and other objects, the present invention provides a method of removal of polymers of the type including bromine, chlorine, silicon, and carbon, present on a semiconductor wafer partly covered with resist, including rotating the wafer in its plane around its axis, in an enclosure under a controlled atmosphere, at ambient temperature, including the steps of:

rotating the wafer at a speed between 500 and 2000 CPM in an enclosure filled with nitrogen; sprinkling the wafer with water, substantially at the center of the wafer;

introducing hydrofluoric acid during a determined cleaning time, while maintaining the sprinkling; and rinsing the wafer by continuing the sprinkling to remove any trace of hydrofluoric acid from the wafer, at the end of the cleaning time.

According to an aspect of the present invention, the semiconductor wafer is covered with silicon oxide, topped with patterns, each of which is formed of polysilicon covered with resist, the polysilicon having undergone a plasma etching causing the formation of a polymer on the substantially vertical walls of the patterns.

According to an embodiment of the present invention, the hydrofluoric acid is introduced in the enclosure under a pressure close to the atmospheric pressure at a flow rate from 20 to 90 $cm^3$ per minute.

According to an embodiment of the present invention, the cleaning duration is comprised between 3 and 5 seconds.

According to an embodiment of the present invention, the water is a deionized water and the water is supplied at a rate of approximately 430 $cm^3$ per minute.

According to an embodiment of the present invention, the temperature of the enclosure is substantially 30° C.

The foregoing objects, features and advantages of the present invention will be discussed in detail in the following non-limiting description of specific embodiments in connection with FIG. 1, which shows an example of a device enabling to implement the present invention.

DETAILED DESCRIPTION

FIG. 1 shows a very simplified view of a spinner 1 arranged in an enclosure 2-3. Semiconductor wafer 4 which is desired to be cleaned is laid, substantially centered, on the plate of spinner 1 and maintained on this plate, for example, by suction.

Gaseous hydrofluoric acid dissolved in nitrogen is introduced in enclosure 2-3 by an inlet opening 5, then crosses a porous wall 6 and arrives on semiconductor wafer 4.

A squirt of pure water 7 arrives in enclosure 2-3 on semiconductor wafer 4 through a nozzle 8. The shape of nozzle 8 and the flow rate of water squirt 7 are calculated so that water squirt 7 substantially touches the center of wafer 4.

A gaseous nitrogen flow enters enclosure 2-3 from an opening 9 located under wafer 4. The function of the nitrogen flow mainly is to prevent the hydrofluoric acid diffusing from wall 6 from passing under wafer 4 and etching the lower surface of wafer 4, but it is also used before the beginning of the cleaning to expel out of the enclosure possible residual gases and, after the cleaning, to dry up the wafer.

An outlet nozzle 10 is used to vent the atmosphere of enclosure 2 and to regulate the pressure in the enclosure to approximately two thirds of the atmospheric pressure.

Wafer 4 is covered with a silicon oxide layer, topped, in particular, with patterns, each of which is formed of polysilicon covered with resist. These patterns have been obtained by plasma etching and at least one residual polymer especially formed of bromine, chlorine, silicon and carbon covers the substantially vertical walls of these patterns. Wafer 4 is laid, substantially centered, on the spinner, with its etched surface turned upwards. Once wafer 4 is located on spinner 1, spinner 1 is rotated at a speed between 500 and 2000 CPM while the enclosure is filled with nitrogen to remove any undesirable atmospheric gas. Once the speed of spinner 1 is established and the enclosure is filled with nitrogen, a nitrogen flow being established between opening 9 and outlet nozzle 10, a water squirt 7 is sent substantially to the center of wafer 4. The flow rate of water squirt 7, as well as the shape of nozzle 8 that introduces water squirt 7 into enclosure 2-3 are set not only so that water squirt 7 touches wafer 4 at its center but also so that wafer 4 is substantially uniformly covered with a thin water film. As an example, this water flow rate can correspond to the water supply conventionally used to rinse a semiconductor wafer after a step of etching by corrosive gases.

Once wafer 4 is substantially uniformly covered with a water film, gaseous hydrofluoric acid HF is introduced into enclosure 2-3 through nozzle 5, for example, at a flow rate comprised between 20 and 90 cm³ per minute for a time comprised between 3 and 5 seconds.

Gaseous hydrofluoric acid is introduced in enclosure 2-3 under a pressure that controls the gas flow rate, slightly higher than the atmospheric pressure.

After having stopped the introduction of gaseous hydrofluoric acid, the wafer is rinsed by being rotated under the water squirt for a time sufficient for any hydrofluoric trace to be removed from the wafer surface.

At the end of the rinsing, the water supply is cut down and the wafer is rotated for a time sufficient for its rinsing. The rotation speed is increased to spin-dry.

All operations can occur at ambient temperature, that is, approximately 30° C.

Measurements have established that according to the present invention, the silicon oxide is only etched across a thickness of approximately 3 nanometers, to be compared with approximately 30 nanometers with the prior method using water in gas form. Such a reduction of the erosion undergone by the silicon oxide substantially decreases the chances of piercing of the oxide layer, and thus increases the reliability of the cleaning process.

Further, the inventors have noted that a cleaning according to the present invention causes no delamination of the resin layer.

Finally, an efficiency increase of approximately 10%, measured in number of good circuits per wafer, has been observed for batches of wafers cleaned according to the present invention, with respect to wafer batches on which the residual polymer has not been removed.

The present invention thus performs, in a single step, cleaning of the residual brominated polymers appearing upon the plasma etching of a polysilicon layer covering a silicon oxide layer, while substantially decreasing the risks of piercing the oxide layer and the risks of delamination of the resin layer having enabled the plasma etching.

Although the reasons why the present invention results in such an improvement over the prior art cannot be demonstrated with certainty, the present inventors believe that the following hypothesis can be considered.

The chemical reaction between hydrofluoric acid and silicon oxide is a reaction in two steps:

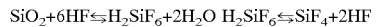

The first step requires a certain amount of water to be started. Conversely, the presence of excess water in liquid form strongly displaces the chemical equilibrium to the left. Further, the dilution of HF in the liquid water film decreases the HF concentration in the first step, which also slows down the reaction to the resin while enabling a sufficient etching of the residual polymers.

This slowing down of the reaction due to the water saturation can explain that when, according to the present invention, the wafer is covered with water, the etching of the silicon oxide layer by hydrofluoric acid is slower than when the water is only present in gas form.

According to the same hypothesis, the water saturation can slow down the hydrofluoric acid etching of the adherence enhancer located between the resin layer and the polysilicon, which adherence enhancer especially includes water.

Finally, the presence of liquid water does not seem to decrease the etching by hydrofluoric acid of the residual polymer film formed of bromine, chlorine, silicon, and carbon and during the cleaning of a wafer according to the present invention, the conductive properties, undesirable, of the brominated polymer seem to deteriorate rapidly.

The present invention has been described in relation to a device that cleans a wafer exhibiting residual polymers after an etching operation while preserving resin surfaces, but those skilled in the art will easily apply the above descriptions to a device that cleans plates exhibiting other types of impurities to be removed while maintaining resin surfaces that are to be kept.

Similarly, the present invention has been described in relation to a device that processes a single wafer, but those skilled in the art will easily apply the above descriptions to a device that processes several wafers at the same time.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of removal of polymeric material from substantially vertical walls which are formed on a semiconductor wafer including at least a portion covered with a resist layer, the method comprising the steps of:

providing a semiconductor wafer having a polysilicon layer and a resist layer above the polysilicon layer, the polysilicon layer having undergone an etching to form a pattern including substantially vertical walls, the etching forming polymeric material on the substantially vertical walls, the polymeric material including at least one element selected from the group consisting of bromine, chlorine, and silicon;

rotating the semiconductor wafer at a speed between 500 and 2000 CPM in an enclosure filled with nitrogen;

sprinkling the rotating semiconductor wafer with water, substantially at the center of the semiconductor wafer, introducing gaseous hydrogen fluoride, while rotating the semiconductor wafer and maintaining the sprinkling with water, to remove the polymeric material without removing the resist layer;

stopping the introduction of gaseous hydrogen fluoride; and rinsing the rotating wafer by continuing the sprinkling with water to remove any trace of hydrogen fluoride from the semiconductor wafer.

2. The method of claim 1, wherein the semiconductor wafer further comprises a silicon oxide layer topped with said pattern.

3. The method of claim 1, wherein the gaseous hydrogen fluoride is introduced in the enclosure at a flow rate from 20 to 90 $cm^3$ per minute.

4. The method of claim 1, wherein the gaseous hydrogen fluoride is introduced for a time period of between 3 and 5 seconds.

5. The method of claim 1, wherein the water is a deionized water and the water is supplied at a rate of approximately 430 $cm^3$ per minute.

6. The method of claim 1, wherein the temperature of the enclosure is substantially 30° C.

7. The method of claim 1, wherein the substantially vertical walls define a hole in the polysilicon layer.

8. The method of claim 1, wherein the etching comprises a plasma etching.

9. The method of claim 1, wherein the step of sprinkling the rotating semiconductor wafer with water prior to the step of introducing gaseous hydrogen fluoride forms a film of water upon the semiconductor wafer.

* * * * *

UNITED STATES PATENT AND TRADEMARK OFFICE
CERTIFICATE OF CORRECTION

PATENT NO.    : 6,248,179 B1
DATED         : June 19, 2001
INVENTOR(S)   : Didier Severac and Michel Derie It is certified that error appears in the above-identified patent and that said Letters Patent is hereby corrected as shown below:

Title page,
Item [54], should read
-- METHOD OF REMOVING POLYMERIC MATERIAL ON A SILICON WAFER --

Signed and Sealed this

Ninth Day of April, 2002

Attest:

Attesting Officer

JAMES E. ROGAN
Director of the United States Patent and Trademark Office